United States Patent
Zheng (10) Patent No.: US 10,573,672 B2
(45) Date of Patent: Feb. 25, 2020

(54) ARRAY SUBSTRATE AND FABRICATION METHOD THEREOF AND DISPLAY PANEL

(71) Applicants: BOE TECHNOLOGY GROUP CO., LTD., Beijing (CN); CHENGDU BOE OPTOELECTRONICS TECHNOLOGY CO., LTD., Chengdu, Sichuan (CN)

(72) Inventor: Haihong Zheng, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu, Sichuan (CN)

(*) Notice: Subject to any disclaimer, the term of this patent is extended or adjusted under 35 U.S.C. 154(b) by 0 days.

(21) Appl. No.: 15/994,420

(22) Filed: May 31, 2018

(65) Prior Publication Data

US 2019/0067339 A1    Feb. 28, 2019

(30) Foreign Application Priority Data

Aug. 24, 2017  (CN) .......................... 2017 1 0733947

(51) Int. Cl.
  *H01L 27/12*   (2006.01)
  *H01L 29/786*  (2006.01)
  *G02F 1/1362*  (2006.01)

(52) U.S. Cl.
  CPC ........ *H01L 27/1285* (2013.01); *H01L 27/124* (2013.01); *H01L 27/1222* (2013.01); *H01L 29/78675* (2013.01); *G02F 1/13624* (2013.01)

(58) Field of Classification Search
  CPC ... H01L 33/486; H01L 33/502; H01L 33/505; H01L 33/507; H01L 33/54; H01L 33/56;
  (Continued)

(56) References Cited

U.S. PATENT DOCUMENTS 5,585,291 A * 12/1996 Ohtani ................. H01L 27/12
                                                    438/486
2002/0179004 A1  12/2002 Jung
(Continued)

FOREIGN PATENT DOCUMENTS

| CN | 102708788 A | 10/2012 |
| CN | 106847746 A | 6/2017 |
| CN | 106847825 A | 6/2017 |

OTHER PUBLICATIONS

The First Chinese Office Action dated Apr. 12, 2019; Appln. No. 201710733947.7.
(Continued)

*Primary Examiner* — Zandra V Smith
*Assistant Examiner* — Andre C Stevenson
(74) *Attorney, Agent, or Firm* — Ladas & Parry LLP (57) ABSTRACT

An array substrate and a fabrication method thereof and a display panel are provided. The array substrate including a first thin film transistor and a second thin film transistor. The fabrication method including: forming an amorphous silicon thin film on a base substrate; forming a laser blocking layer on the amorphous silicon thin, film; irradiating, by laser, the amorphous silicon thin film with the laser blocking layer formed thereon, to transform the amorphous silicon thin film into a crystalline silicon thin film; and patterning the crystalline silicon thin film to form a first active region pattern of the first thin film transistor and a second active region pattern of the second thin film transistor, wherein, as to a same type of carrier, a mobility of the first active region pattern is substantially smaller than a mobility of the second active region pattern.

17 Claims, 5 Drawing Sheets

(58) Field of Classification Search
CPC ....... H01L 2933/0041; H01L 2933/005; G02F 1/1335; B32B 2457/206
See application file for complete search history.

(56) References Cited

U.S. PATENT DOCUMENTS

| | | | | |
|---|---|---|---|---|
| 2004/0180274 | A1* | 9/2004 | Jung | ........................ C30B 1/023 430/5 |
| 2005/0048382 | A1* | 3/2005 | Jung | ................... H01L 21/2026 430/5 |
| 2013/0140573 | A1* | 6/2013 | Nakamura | ........ H01L 21/02532 257/59 |

OTHER PUBLICATIONS

The Third Chinese Office Action dated Sep. 23, 2019; Appln. No. 201710733947.7.

* cited by examiner

ARRAY SUBSTRATE AND FABRICATION METHOD THEREOF AND DISPLAY PANEL

The present application claims priority of Chinese Patent Application No. 201710733947.7 filed on Aug. 24, 2017, the disclosure of which is incorporated herein by reference in its entirety as part of the present application.

TECHNICAL FIELD

Embodiments of the present disclosure relate to an array substrate and a fabrication method thereof and a display panel.

BACKGROUND

A Liquid Crystal Display (LCD) is very popular and becomes a mainstream of current displays, due to characteristics such as low power consumption, high image quality, small volume, and light weight. At present, the liquid crystal display is mainly a thin film transistor (TFT) liquid crystal display, whose display panel usually includes a color filter substrate and a TFT array substrate arranged opposite to each other, as well as a liquid crystal layer provided therebetween.

SUMMARY

An embodiment of the present disclosure provides a fabrication method of an array substrate, the array substrate including a first thin film transistor and a second thin film transistor, the fabrication method including: forming an amorphous silicon thin film on a base substrate; forming a laser blocking layer on the amorphous silicon thin film; irradiating, by laser, the amorphous silicon thin film with the laser blocking layer formed thereon, to transform the amorphous silicon thin film into a crystalline silicon thin film; and patterning the crystalline silicon thin film to form a first active region pattern of the first thin film transistor and a second active region pattern of the second thin film transistor, wherein, as to a same type of carrier, a mobility of the first active region pattern is substantially smaller than a mobility of the second active region pattern.

In an example, a crystallinity of the first active region pattern is substantially smaller than a crystallinity of the second active region pattern.

In an example, as to the same type of carrier, a ratio of the mobility of the first active region pattern of the first thin film transistor to the mobility of the second active region pattern of the second thin film transistor is within a range of 50% to 80%.

In an example, the laser blocking layer is made of an insulating material, and the laser blocking layer is reserved in the array substrate.

In an example, after the patterning the crystalline silicon thin film to form a first active region pattern of the first thin film transistor and a second active region pattern of the second thin film transistor, the fabrication method further comprises: sequentially forming a first insulating layer, a gate electrode layer, a second insulating layer and a source-drain electrode layer on the laser blocking layer, the source-drain electrode layer including a first source electrode and a first drain electrode of the first thin film transistor, as well as a second source electrode and a second drain electrode of the second thin film transistor, the first source electrode and the first drain electrode being connected with the first active region pattern through corresponding first via holes respectively, the second source electrode and the second drain electrode being connected with the second active region pattern through corresponding second via holes respectively; and the first via holes passing through the laser blocking layer, the first insulating layer and the second insulating layer.

In an example, the laser blocking layer is made of a conductive material, the fabrication method further includes: removing the laser blocking layer, before the patterning the crystalline silicon thin film to form the first active region pattern of the first thin film transistor and the second active region pattern of the second thin film transistor and after the irradiating, by laser, the amorphous silicon thin film with the laser blocking layer formed thereon, to transform the amorphous silicon thin film into the crystalline silicon thin film.

In an example, the laser blocking layer is made of a conductive material, the fabrication method further includes: removing the laser blocking layer, after the patterning the crystalline silicon thin film to form a first active region pattern of the first thin film transistor and a second active region pattern of the second thin film transistor.

In an example, the removing the laser blocking layer includes: forming a photoresist layer pattern on the laser blocking layer, the photoresist pattern completely exposing the laser blocking layer; etching away the laser blocking layer; and removing a residual portion of the photoresist layer.

In an example, after the patterning the crystalline silicon thin film to form the first active region pattern of the first thin film transistor and the second active region pattern of the second thin film transistor, the fabrication method further includes: sequentially forming a first insulating layer, a gate electrode layer, a second insulating layer and a source-drain electrode layer on the first active region pattern and the second active region pattern, the source-drain electrode layer including a first source electrode and a first drain electrode of the first thin film transistor, as well as a second source electrode and a second drain electrode of the second thin film transistor, the first source electrode and the first drain electrode being connected with the first active region pattern through corresponding third via holes respectively, and the second source electrode and the second drain electrode being connected with the second active region pattern through corresponding fourth via holes respectively; and the third via holes and the fourth via holes passing through the first insulating layer and the second insulating layer.

In an example, the first thin film transistor is a switching thin film transistor, and the second thin film transistor is a driving thin film transistor.

In an example, the array substrate further includes a gate line and a data line, a source electrode of the first thin film transistor is connected with the data line, a gate electrode of the first thin film transistor is connected with the gate line, and a drain electrode of the first thin film transistor is electrically connected with a gate electrode of the second thin film transistor.

Another embodiment of the present disclosure provides an array substrate including: a base substrate; and a first thin film transistor and a second thin film transistor on the base substrate, wherein, as to a same carrier, a mobility of a first active region pattern of the first thin film transistor is substantially smaller than a mobility of a second active region pattern of the second thin film transistor.

In an example, a crystallinity of the first active region pattern is substantially smaller than a crystallinity of the second active region pattern.

In an example, as to a same type of carrier, a ratio of the mobility of the first active region pattern of the first thin film transistor to the mobility of the second active region pattern of the second thin film transistor is within a range of 50% to 80%.

In an example, the active layer further includes thereon a laser blocking layer, the laser blocking layer is made of an insulating material, and an orthogonal projection of the laser blocking layer on the base substrate overlaps with an orthogonal projection of the first active region pattern on the base substrate.

In an example, the orthogonal projection of the laser blocking layer on the base substrate coincides with the orthogonal projection of the first active region pattern on the base substrate.

In an example, the first thin film transistor is a switching thin film transistor, and the second thin film transistor is a driving thin film transistor.

In an example, the array substrate further includes a gate line and a data line, a source electrode of the first thin film transistor is connected with the data line, a gate electrode of the first thin film transistor is connected with the gate line, and a drain electrode of the first thin film transistor is connected with a gate electrode of the second thin film transistor.

Yet another embodiment of the present disclosure provides a display panel, including the array substrate described above.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the present disclosure and thus are not limitative of the present disclosure.

DETAILED DESCRIPTION

In order to make objects, technical details and advantages of the embodiments of the present disclosure apparent, the technical solutions of the embodiment will be described in a clearly and fully understandable way in connection with the drawings related to the embodiments of the present disclosure. It is obvious that the described embodiments are just a part but not all of the embodiments of the present disclosure. Based on the described embodiments herein, those skilled in the art can obtain other embodiment(s), without any inventive work, which should be within the scope of the present disclosure.

Hereinafter, implementation procedures according to the embodiments of the present disclosure will be described in detail in conjunction with the accompanying drawings of the specification. It should be noted that same or similar reference signs always denote same or similar elements or elements having same or similar functions. The embodiments described below with reference to the accompanying drawings are exemplary, which are used only for explaining the present disclosure, and should not be construed as limitation to the present disclosure.

A TFT fabrication method is a Low Temperature Polysilicon (LTPS) technology, that is, forming an amorphous silicon layer on a substrate, then forming poly-silicon by annealing with excimer laser, thereafter, making a pattern of poly-silicon by exposure, development and etching, and finally, sequentially making a first insulating layer, a gate electrode layer, a second insulating layer, a source-drain electrode layer, and the like. The resulting TFTs have higher electron mobility. However, in actual application, not all TFTs on the array substrate need such high electron mobility; for some specific TFTs, for example, a switching thin film transistor, excessively high electron mobility may cause severe leakage current, so that it cannot be turned off quickly and accurately during operation of a display device.

Figure 1:
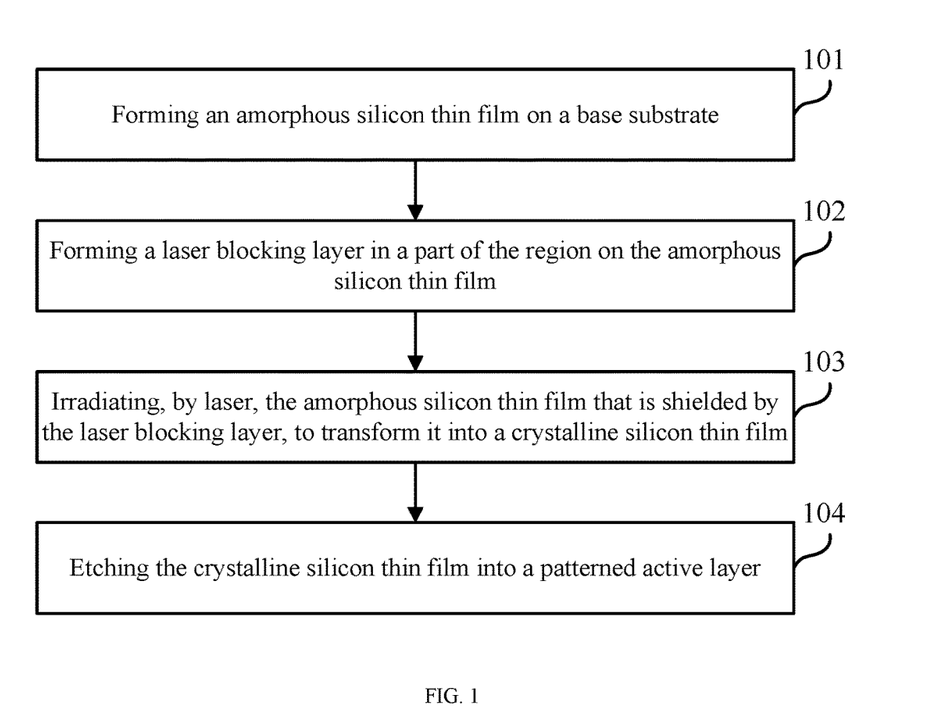
FIG. 1 is a flow chart of a fabrication method of an array substrate provided by an embodiment of the present disclosure.

With reference to FIG. 1, an embodiment of the present disclosure provides a fabrication method of an array substrate, including:

Step 101: forming an amorphous silicon thin film on a base substrate.

Step 102: forming a laser blocking layer in part of the region on the amorphous silicon thin film.

For example, an orthogonal projection of the laser blocking layer on the base substrate overlaps with an orthogonal projection of a first active region pattern of a first thin film transistor having preset electron mobility on the base substrate. For example, the first thin film transistor can be a switching thin film transistor.

Step 103: with the shielding of the laser blocking layer, the amorphous silicon thin film is irradiated by laser to be transformed into a crystalline silicon thin film.

For example, the amorphous silicon thin film can be irradiated by excimer laser; since a partial region of the amorphous silicon thin film is shielded by the laser blocking layer, the unshielded amorphous silicon thin film irradiated by laser will be further transformed into a poly-silicon thin film; while with respect to the amorphous silicon thin film shielded by the laser blocking layer, because it is shielded by the laser blocking layer, it will be transformed into transitional crystalline silicon having electron mobility between that of amorphous silicon and that of poly-silicon. A crystallinity of the transitional crystalline silicon is between that of amorphous silicon and that of poly-silicon.

Step 104: transforming the crystalline silicon thin film into a patterned active layer.

For example, the patterned active layer includes a first active region pattern of a first thin film transistor and a second active region pattern of a second thin film transistor; an electron mobility of the first thin film transistor is substantially smaller than an electron mobility of the second thin film transistor. For example, the crystalline silicon thin film can be transformed into the patterned active layer by using processes such as exposure, development and etching. For example, the first active region pattern is made of transitional crystalline silicon, and the second active region pattern is made of poly-silicon. The second thin film transistor can be a driving thin film transistor. For example, the electron mobility of the first thin film transistor is less than or equal to 95% of the electron mobility of the second thin film transistor.

In the embodiment of the present disclosure, by forming the laser blocking layer in the partial region on the amorphous silicon thin film, when amorphous silicon is transformed into poly-silicon by using an excimer laser annealing process, since the partial region of the amorphous silicon thin film is shielded by the laser blocking layer, the unshielded amorphous silicon thin film that is irradiated by laser will be further transformed into the poly-silicon thin film; while with respect to the amorphous silicon thin film shielded by the laser blocking layer, because it is shielded by the laser blocking layer, it will be transformed into transitional crystalline silicon having the electron mobility between that of amorphous silicon and that of poly-silicon, and when the transitional crystalline silicon is further fabricated into the thin film transistor, leakage current of the thin film transistor will be reduced, and the problem that some thin film transistors of the array substrate have higher leakage current and cannot be turned off quickly and accurately during operation of the display device will be solved.

For example, with respect to the laser blocking layer, it can be an insulating material, and can also be a conductive material. When the laser blocking layer is an insulating material, the laser blocking layer can be removed, and can be reserved after completing its shielding function. When the laser blocking layer is an insulating material, the laser blocking layer can be reserved, to omit a process of removing the laser blocking layer. However, when the laser blocking layer is a conductive material, the laser blocking layer needs to be removed after completing its shielding function, so as to prevent occurrence of short-circuit of the thin film transistor due to presence of the laser blocking layer. Hereinafter, fabrication methods of array substrates whose laser blocking layers are respectively a conductive material and an insulating material will be respectively described in detail specifically through embodiments.

Figure 2:
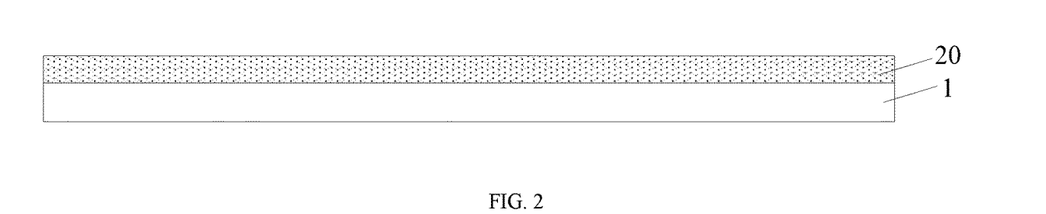
FIG. 2 is a structural schematic diagram of an array substrate having an amorphous silicon thin film formed, according to an embodiment of the present disclosure.

With reference to FIG. 2 to FIG. 6, an embodiment of the present disclosure provides a fabrication method of an array substrate. The array substrate includes a switching thin film transistor T1 and a driving thin film transistor T2. The laser blocking layer is an insulating material. The fabrication method includes:

Forming an amorphous silicon thin film 20 on a base substrate 1. The array substrate after the amorphous silicon thin film 20 is formed on the base substrate 1 is as shown in FIG. 2.

Figure 3:
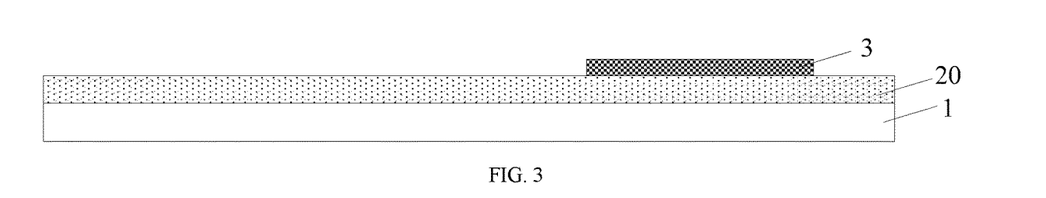
FIG. 3 is a structural schematic diagram of the array substrate having a laser blocking layer formed, according to the embodiment of the present disclosure.

Forming a laser blocking layer 3 in a part of the region on the amorphous silicon thin film 20, as shown in FIG. 3.

An orthogonal projection of the laser blocking layer 3 on the base substrate 1 overlaps with an orthogonal projection of a first active region pattern of the switching thin film transistor to be formed on the base substrate 1. A structural schematic diagram of the array substrate after the laser blocking layer 3 is formed in part of the region on the amorphous silicon thin film 20 is as shown in FIG. 3.

Figure 4:
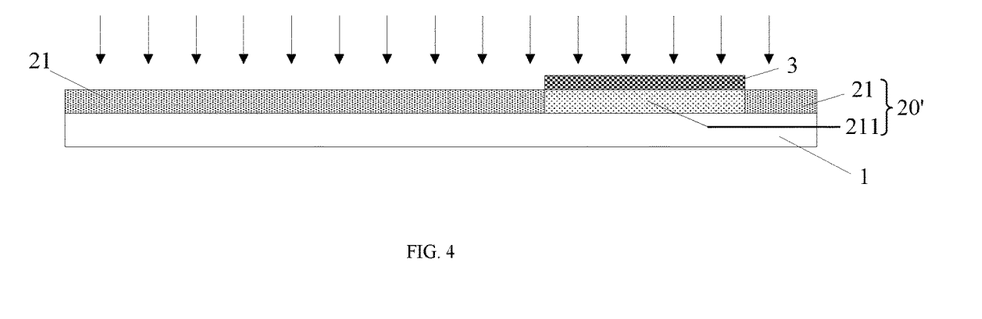
FIG. 4 is a structural schematic diagram of the array substrate when an amorphous silicon thin film is being irradiated, according to the embodiment of the present disclosure.

Irradiating, by excimer laser, the amorphous silicon thin film 20 that is shielded by the laser blocking layer 3, to transform it into a crystalline silicon thin film 20', as shown in FIG. 4.

The crystalline silicon thin film 20' includes a transitional crystalline silicon 211 and a poly-silicon thin film 21. Since the partial region of the amorphous silicon thin film is shielded by the laser blocking layer, the unshielded amorphous silicon thin film that is irradiated by laser will be further transformed into the poly-silicon thin film 21; while with respect to the amorphous silicon thin film shielded by the laser blocking layer, because shielded by the laser blocking layer, it will be transformed into a transitional crystalline silicon 211 having electron mobility between that of amorphous silicon and that of poly-silicon. For example, as to the same type of carrier, for example, electron, a ratio of mobility of the transitional crystalline silicon 211 for forming a first active region pattern 5-1 of the switching thin film transistor T1 to mobility of the poly-silicon thin film 21 for forming a second active region pattern 5-2 of the driving thin film transistor T2 is within a range of 50% to 80%. A schematic diagram when the amorphous silicon thin film is irradiated by excimer laser is as shown in FIG. 4.

Figure 5:
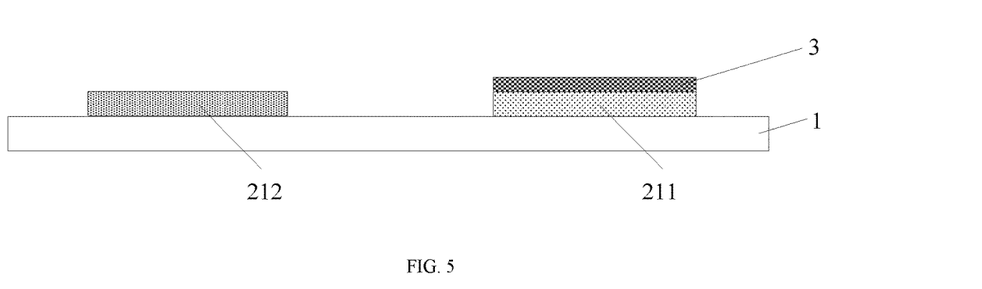
FIG. 5 is a structural schematic diagram of the array substrate having a patterned active layer formed, according to the embodiment of the present disclosure.

The crystalline silicon thin film 20' is transformed into a patterned active layer by processes such as exposure, development, and etching, wherein, the patterned active layer includes a first active region pattern 211 of the switching thin film transistor, and a second active region pattern 212 of the driving thin film transistor, and an electron mobility of the switching thin film transistor is substantially smaller than an electron mobility of the driving thin film transistor. A structural schematic diagram of the array substrate after the patterned active layer is formed is as shown in FIG. 5.

Figure 6:
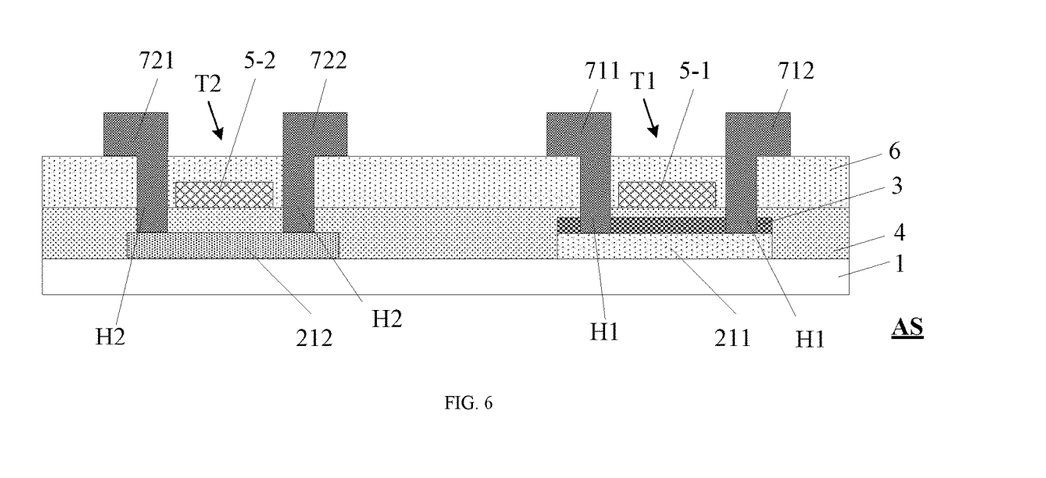
FIG. 6 is a structural schematic diagram of the array substrate having a source-drain electrode formed, according to the embodiment of the present disclosure.

Step 5: sequentially forming a first insulating layer 4, a gate electrode layer 5, a second insulating layer 6 and a source-drain electrode layer 7 on the laser blocking layer 3, wherein, the source-drain electrode layer 7 includes a first source electrode 711 and a first drain electrode 712 of the switching thin film transistor, as well as a second source electrode 721 and a second drain electrode 722 of the driving thin film transistor. The first source electrode 711 and the first drain electrode 712 are connected with the first active region pattern 211 through corresponding first via holes H1; and the second source electrode 721 and the second drain electrode 722 are connected with the second active region pattern 212 through corresponding second via holes respectively. The first via holes pass through the laser blocking layer 3, the first insulating layer 4 and the second insulating layer 6. A structural schematic diagram of the array substrate after the source-drain electrode layer is formed is as shown in FIG. 6. For example, before the forming the first insulating layer, the active layer can also be lightly doped by using a first plasma injection process, to increase an electron mobility and further satisfy an electron mobility of a channel region. After a gate electrode layer is formed, regions on both sides of the channel region of the active layer are heavily doped by using a second plasma injection process, so as to respectively form a first source region and a first drain region in a first active region, wherein, the first source electrode is connected with the first source region, and the first drain electrode is connected with the first drain region; and a second source region and a second drain region are respectively formed in a second active region, wherein, the second source electrode is connected with the second source region, and the second drain electrode is connected with the second drain region.

Another embodiment of the present disclosure provides a fabrication method of an array substrate. The array substrate includes a switching thin film transistor T1 and a driving thin film transistor T2. The laser blocking layer is a conductive material. The fabrication method includes:

Forming an amorphous silicon thin film 20 on a base substrate 1. The array substrate after the amorphous silicon thin film 20 is formed on the base substrate 1 is as shown in FIG. 2.

Forming a laser blocking layer 3 in a part of the region on the amorphous silicon thin film 20, as shown in FIG. 3.

An orthogonal projection of the laser blocking layer 3 on the base substrate 1 overlaps with an orthogonal projection of a first active region pattern of the switching thin film transistor to be formed on the base substrate 1. A structural schematic diagram of the array substrate after the laser blocking layer 3 is formed in the partial region on the amorphous silicon thin film 20 is as shown in FIG. 3.

Irradiating, by excimer laser, the amorphous silicon thin film 20 that is shielded by the laser blocking layer 3, to transform it into a crystalline silicon thin film 20', as shown in FIG. 4.

The crystalline silicon thin film 20' includes a transitional crystalline silicon 211 and a poly-silicon thin film 21. Since the partial region of the amorphous silicon thin film is shielded by the laser blocking layer, the unshielded amorphous silicon thin film that is irradiated by laser will be further transformed into the poly-silicon thin film 21; while with respect to the amorphous silicon thin film shielded by the laser blocking layer, because shielded by the laser blocking layer, it will be transformed into transitional crystalline silicon 211 having electron mobility between that of amorphous silicon and that of poly-silicon. A structural schematic diagram when the amorphous silicon thin film is irradiated by excimer laser is as shown in FIG. 4.

The irradiated amorphous silicon thin film is transformed into a patterned active layer by processes such as exposure, development and etching. The patterned active layer includes a first active region pattern 211 of the switching thin film transistor, and a second active region pattern 212 of the driving thin film transistor. An electron mobility of the switching thin film transistor is substantially smaller than an electron mobility of the driving thin film transistor. A structural schematic diagram of the array substrate after the patterned active layer is formed is as shown in FIG. 5.

Figure 7:
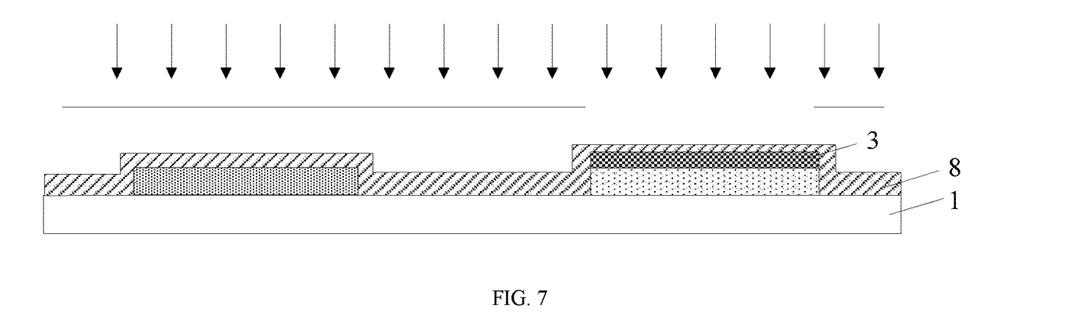
FIG. 7 is a structural schematic diagram of an array substrate after an entire photoresist layer is formed on a laser blocking layer, according to an embodiment of the present disclosure.

Forming a photoresist layer 8 on the laser blocking layer 3. For example, a positive photoresist can be adopted. A structural schematic diagram of the array substrate after the photoresist layer 8 is formed on the laser blocking layer 3 is as shown in FIG. 7.

Irradiating a photoresist layer 3 under the shielding of a patterned mask. The mask has a hollow portion in a region corresponding to the laser blocking layer. A schematic diagram when the photoresist layer 3 is irradiated with the patterned mask is as shown in FIG. 7.

Figure 8:
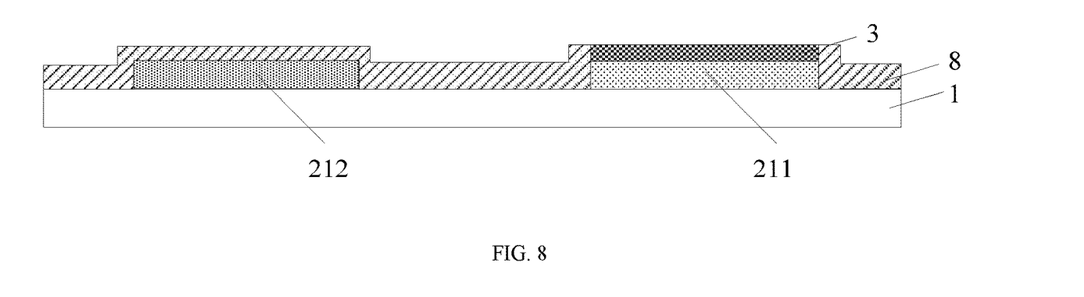
FIG. 8 is a structural schematic diagram of the array substrate after a patterned photoresist layer is formed, according to the embodiment of the present disclosure.

Removing a photoresist that is irradiated by light, by processes such as development and etching, to form a photoresist layer pattern which matches with the laser blocking layer. That is, an orthogonal projection of the laser blocking layer 3 on the base substrate 1 is complementary to an orthogonal projection of the pattern of the photoresist layer on the base substrate 1. A structural schematic diagram of the array substrate after the photoresist that is irradiated by light is removed is as shown in FIG. 8.

Figure 9:
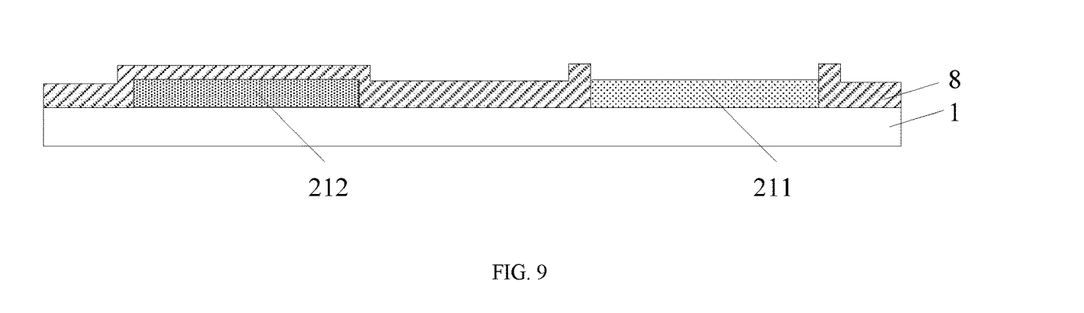
FIG. 9 is a structural schematic diagram of the array substrate after the laser blocking layer is removed, according to the embodiment of the present disclosure.

Removing the laser blocking layer 3. A structural schematic diagram of the array substrate after the laser blocking layer 3 is removed is as shown in FIG. 9.

Figure 10:
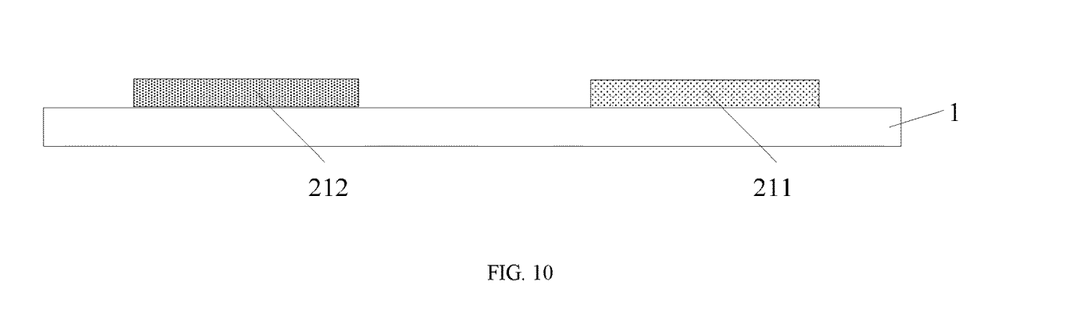
FIG. 10 is a structural schematic diagram of the array substrate after residual photoresist is removed, according to the embodiment of the present disclosure.

Removing the remaining photoresist layer 8. A structural schematic diagram of the array substrate after the remaining photoresist layer 8 is removed is as shown in FIG. 10.

Figure 11:
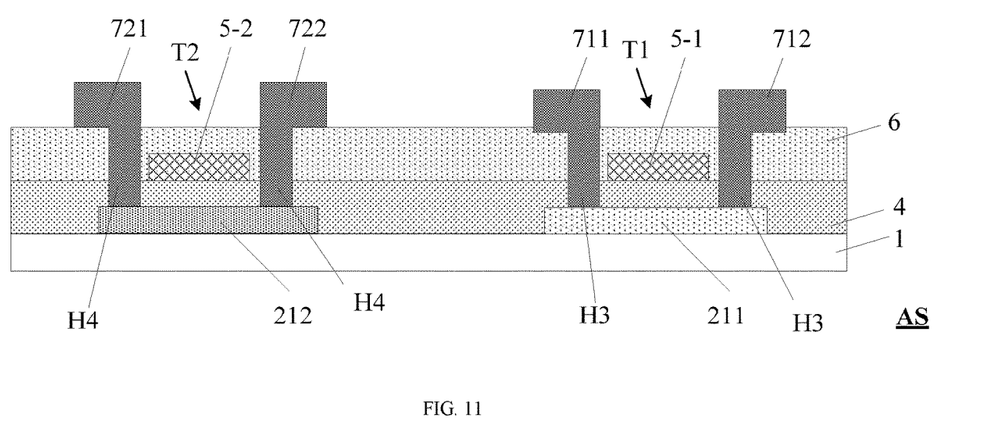
FIG. 11 is a structural schematic diagram of the array substrate after a source-drain electrode layer is formed, according to the embodiment of the present disclosure.

Sequentially forming a first insulating layer 4, a gate electrode layer 5, a second insulating layer 6 and a source-drain electrode layer 7 on the active layer. The source-drain electrode layer 7 includes a first source electrode 711 and a first drain electrode 712 of the switching thin film transistor, as well as a second source electrode 721 and a second drain electrode 722 of the driving thin film transistor; the first source electrode 711 and the first drain electrode 712 are connected with the first active region pattern 211 through corresponding third via holes H3; and the second source electrode 721 and the second drain electrode 722 are connected with the second active region pattern 212 through corresponding fourth via holes 144 respectively. Both the third via holes H3 and the fourth via holes H4 pass through the first insulating layer 4 and the second insulating layer 6. A structural schematic diagram of the array substrate after the source-drain electrode layer is formed is as shown in FIG. 11. For example, before the forming the first insulating layer, the active layer can also be lightly doped by using a first plasma injection process, to increase electron mobility and further satisfy electron mobility of a channel region. After a gate electrode layer is formed, regions on both sides of the channel region of the active layer are heavily doped, by using a second plasma injection process, so as to respectively form a first source region and a first drain region in a first active region, wherein, the first source electrode is connected with the first source region, and the first drain electrode is connected with the first drain region; and a second source region and a second drain region are respectively formed in a second active region, wherein, the second source electrode is connected with the second source region, and the second drain electrode is connected with the second drain region.

A further embodiment of the present disclosure provides a fabrication method of an array substrate. The array substrate includes a switching thin film transistor T1 and a driving thin film transistor T2. The laser blocking layer is a conductive material. In this embodiment, the laser blocking layer is removed before a crystalline silicon thin film is transformed into a patterned active layer. The fabrication method includes:

Forming an amorphous silicon thin film 20 on a base substrate 1. The array substrate after the amorphous silicon thin film 20 is formed on the base substrate 1 is as shown in FIG. 2.

Forming a laser blocking layer 3 in a part of the region on the amorphous silicon thin film 20, as shown in FIG. 3.

An orthogonal projection of the laser blocking layer 3 on the base substrate 1 overlaps with an orthogonal projection of a first active region pattern of the switching thin film transistor on the base substrate 1. A structural schematic diagram of the array substrate after the laser blocking layer 3 is formed in the partial region on the amorphous silicon thin film 20 is as shown in FIG. 3.

Irradiating, by excimer laser, the amorphous silicon thin film 20 that is shielded by the laser blocking layer 3, to transform it into a crystalline silicon thin film 20', as shown in FIG. 4.

The crystalline silicon thin film 20' includes a transitional crystalline silicon portion 211 and a poly-silicon thin film 21. Since a preset region of the amorphous silicon thin film is shielded by the laser blocking layer, the unshielded amorphous silicon thin film that is irradiated by laser will be further transformed into the poly-silicon thin film 21; while with respect to the amorphous silicon thin film shielded by the laser blocking layer, because shielded by the laser blocking layer, it will be transformed into a transitional crystalline silicon 211 having electron mobility between that of amorphous silicon and that of poly-silicon. A schematic diagram when the amorphous silicon thin film is irradiated by excimer laser is as shown in FIG. 4.

Figure 12:
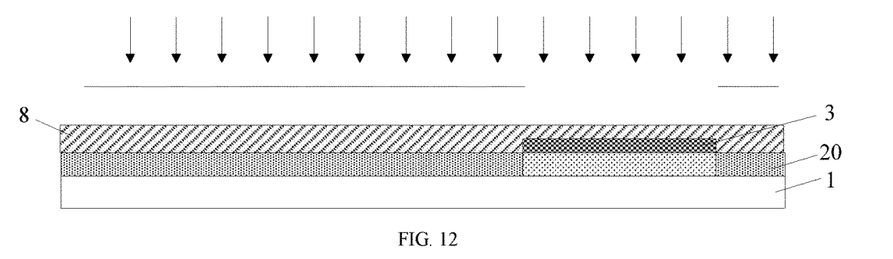
FIG. 12 is a structural schematic diagram of an array substrate after an entire photoresist layer is formed on a laser blocking layer, according to an embodiment of the present disclosure.

Forming a photoresist layer 8 on the laser blocking layer 4. For example, positive photoresist can be adopted. A structural diagram of the array substrate after the photoresist layer 8 is formed on the laser blocking layer 4 is as shown in FIG. 12.

Irradiating the photoresist layer 8 under the shielding by a patterned mask. The mask has a hollow portion in a region corresponding to the laser blocking layer. A schematic diagram when the photoresist layer 8 is irradiated with the patterned mask is as shown in FIG. 12.

Figure 13:
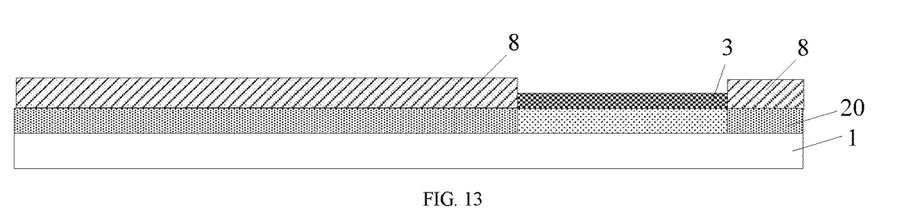
FIG. 13 is a structural schematic diagram of the array substrate after a patterned photoresist layer is formed, according to the embodiment of the present disclosure.

Removing a photoresist that is irradiated by light, by processes such as development and etching, to form a photoresist layer pattern which matches with the laser blocking layer. For example, an orthogonal projection of the laser blocking layer 3 on the base substrate 1 is complementary to an orthogonal projection of the pattern of the photoresist layer on the base substrate 1. A structural schematic diagram of the array substrate after the photoresist that is irradiated by light is removed is as shown in FIG. 13.

Figure 14:
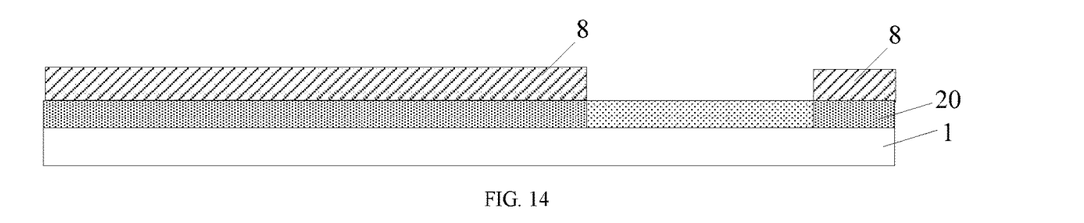
FIG. 14 is a structural schematic diagram of the array substrate after the laser blocking layer is removed, according to the embodiment of the present disclosure.

Removing the laser blocking layer 3. Here, for example, the laser blocking layer 3 is etched away. A structural schematic diagram of the array substrate after the laser blocking layer 3 is removed is as shown in FIG. 14.

Figure 15:
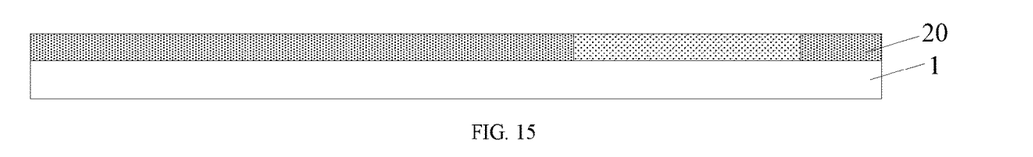
FIG. 15 is a structural schematic diagram of the array substrate after residual photoresist is removed, according to the embodiment of the present disclosure.

Removing the remaining photoresist layer 8. A structural schematic diagram of the array substrate after the remaining photoresist layer 8 is removed is as shown in FIG. 15.

Transforming the crystalline silicon thin film into a patterned active layer by using processes such as exposure, development and etching. A pattern of the active layer includes a first active region pattern 211 of the switching thin film transistor, and a second active region pattern 212 of the driving thin film transistor. An electron mobility of the switching thin film transistor is substantially smaller than an electron mobility of the driving thin film transistor. A structural schematic diagram of the array substrate after the patterned active layer is formed is as shown in FIG. 10.

Sequentially forming a first insulating layer 4, a gate electrode layer 5, a second insulating layer 6 and a source-drain electrode layer 7 on the laser blocking layer 3, wherein, the source-drain electrode layer 7 includes a first source electrode 711 and a first drain electrode 712 of the switching thin film transistor, as well as a second source electrode 721 and a second drain electrode 722 of the driving thin film transistor; the first source electrode 711 and the first drain electrode 712 are connected with the first active region pattern 211 through corresponding via holes H3 respectively; and the second source electrode 721 and the second drain electrode 722 are connected with the second active region pattern 212 through corresponding via holes H4 respectively. A structural schematic diagram of the array substrate after the source-drain electrode layer is formed is as shown in FIG. 11. For example, before the forming the first insulating layer, the active layer call also be lightly doped by using a first plasma injection process, to increase electron mobility and further satisfy electron mobility of a channel region. After a gate electrode layer is formed, regions on both sides of the channel region of the active layer are heavily doped by using a second plasma injection process, so as to respectively form a first source region and a first drain region in a first active region, wherein, the first source electrode is connected with the first source region, and the first drain electrode is connected with the first drain region; and a second source region and a second drain region are respectively formed in a second active region, wherein, the second source electrode is connected with the second source region, and the second drain electrode is connected with the second drain region.

With reference to FIG. 11, an embodiment of the present disclosure further provides an array substrate AS fabricated by using the fabrication method provided by any one of the above-described embodiments, including: a patterned active layer provided on a base substrate 1, wherein, a pattern of the active layer includes a first active region pattern 211 of a first thin film transistor, and a second active region pattern 212 of a second thin film transistor, electron mobility of the first thin film transistor is substantially smaller than electron mobility of the second thin film transistor. For example, the active layer further includes: a first insulating layer 4, a gate electrode layer 5, a second insulating layer 6 and a source-drain electrode layer 7 sequentially provided thereon, wherein, the source-drain electrode layer 7 includes a first source electrode 711 and a first drain electrode 712 of the first thin film transistor, and a second source electrode 721 and a second drain electrode 722 of the second thin film transistor; the first source electrode 711 and the first drain electrode 712 are respectively connected with the first active region pattern 211 through a corresponding via hole; and the second source electrode 721 and the second drain electrode 722 are respectively connected with the second active region pattern 212 through a corresponding via hole.

With reference to FIG. 6, for example, if the laser blocking layer is an insulating material, the array substrate is further provided with a laser blocking layer 3 between the active layer and the first insulating layer 4, wherein, an orthogonal projection of the laser blocking layer 3 on the base substrate 1 overlaps with an orthogonal projection of the first active region pattern 211 on the base substrate 1. For example, the orthogonal projection of the laser blocking layer 3 on the base substrate 1 coincides with the orthogonal projection of the first active region pattern 211 on the base substrate 1.

Figure 16:
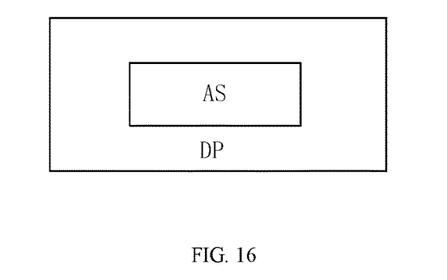
FIG. 16 is a schematic diagram of a display panel according to the embodiment of the present disclosure.

An embodiment of the present disclosure further provides a display panel DP, including the array substrate AS provided by any of the embodiments of the present disclosure, as shown in FIG. 16.

Figure 17:
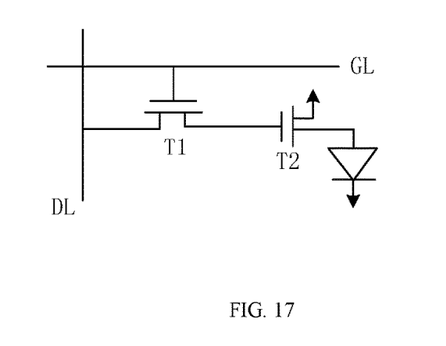
FIG. 17 is a schematic diagram showing an electrical connection relationship of a gate line, a data line, a switching thin film transistor and a driving thin film transistor, according to the embodiment of the present disclosure.

In any one of the foregoing embodiments, with reference to FIG. 17, the array substrate further includes a gate line GL and a data line DL, a source electrode 711 of the switching thin film transistor T1 is connected with the data line DL, a gate electrode 211 of the switching thin film transistor is connected with the gate line GL, and a drain electrode 712 of the switching thin film transistor T2 is electrically connected with a gate electrode 212 of the driving thin film transistor T2.

In the embodiments of the present disclosure, by forming the laser blocking layer in the partial region on the amorphous silicon thin film when amorphous silicon is transformed into poly-silicon by an excimer laser annealing process, since the partial region of the amorphous silicon thin film is shielded by the laser blocking layer, the unshielded amorphous silicon thin film that is irradiated by laser will be further transformed into the poly-silicon thin film; while with respect to the amorphous silicon thin film shielded by the laser blocking layer, because shielded by the laser blocking layer, it will be transformed into transitional crystalline silicon having the electron mobility between that of amorphous silicon and that of poly-silicon. When the type of transitional crystalline silicon is further fabricated into the thin film transistor, a leakage current of the thin film transistor will be reduced, and the problem that some thin film transistors of the array substrate fabricated by using the prior art have a higher leakage current, and cannot be turned off quickly and accurately during operation of the display device is solved.

It is evident that one person skilled in the art can make various changes or modifications to the present disclosure without departure from the spirit and scope of the present disclosure. Thus, if these changes and modifications to the present disclosure are within the scope of the claims of the present disclosure and equivalent technologies, the present disclosure also intends to include all such changes and modifications within its scope.

The invention claimed is:

1. A fabrication method of an array substrate, the array substrate comprising a first thin film transistor and a second thin film transistor, the fabrication method comprising:
forming an amorphous silicon thin film on a base substrate;
forming a laser blocking layer on the amorphous silicon thin film;
irradiating, by laser, the amorphous silicon thin film with the laser blocking layer formed thereon, to transform the amorphous silicon thin film into a crystalline silicon thin film; and
after the amorphous silicon thin film is transformed into the crystalline silicon thin film, patterning the crystalline silicon thin film to form a first active region pattern of the first thin film transistor and a second active region pattern of the second thin film transistor, wherein, as to a same type of carrier, a mobility of the first active region pattern is substantially smaller than a mobility of the second active region pattern,
wherein the laser blocking layer is made of an insulating material, and the laser blocking layer is reserved in the array substrate,
wherein after the patterning the crystalline silicon thin film to form a first active region pattern of the first thin film transistor and a second active region pattern of the second thin film transistor, the fabrication method further comprises:
sequentially forming a first insulating layer, a gate electrode layer, a second insulating layer and a source-drain electrode layer on the laser blocking layer, the source-drain electrode layer including a first source electrode and a first drain electrode of the first thin film transistor, as well as a second source electrode and a second drain electrode of the second thin film transistor, the first source electrode and the first drain electrode being connected with the first active region pattern through corresponding first via holes respectively, the second source electrode and the second drain electrode being connected with the second active region pattern through corresponding second via holes respectively; and the first via holes passing through the laser blocking layer, the first insulating layer and the second insulating layer.

2. The fabrication method according to claim 1, wherein a crystallinity of the first active region pattern is substantially smaller than a crystallinity of the second active region pattern.

3. The fabrication method according to claim 1, wherein as to the same type of carrier, a ratio of the mobility of the first active region pattern of the first thin film transistor to the mobility of the second active region pattern of the second thin film transistor is within a range of 50% to 80%.

4. A fabrication method of an array substrate, the array substrate comprising a first thin film transistor and a second thin film transistor, the fabrication method comprising:
forming an amorphous silicon thin film on a base substrate;
forming a laser blocking layer on the amorphous silicon thin film;
irradiating, by laser, the amorphous silicon thin film with the laser blocking layer formed thereon, to transform the amorphous silicon thin film into a crystalline silicon thin film; and
after the amorphous silicon thin film is transformed into the crystalline silicon thin film,
pattering the crystalline silicon thin film to form a first active region pattern of the first thin film transistor and a second active region pattern of the second thin film transistor, wherein, as to a same type of carrier, a mobility of the first active region pattern is substantially smaller than a mobility of the second active region pattern, wherein the laser blocking layer is made of a conductive material,
the fabrication method further comprises: removing the laser blocking layer, before the patterning the crystalline silicon thin film to form the first active region pattern of the first thin film transistor and the second active region pattern of the second thin film transistor and after the irradiating, by laser, the amorphous silicon thin film with the laser blocking layer formed thereon, to transform the amorphous silicon thin film into the crystalline silicon thin film.

5. The fabrication method according to claim 4, further comprising:
removing the laser blocking layer, after the patterning the crystalline silicon thin film to form a first active region pattern of the first thin film transistor and a second active region pattern of the second thin film transistor.

6. The fabrication method according to claim 4, wherein the removing the laser blocking layer includes:
 forming a photoresist layer pattern on the laser blocking layer, the photoresist pattern completely exposing the laser blocking layer;
 etching away the laser blocking layer; and
 removing a residual portion of the photoresist layer.

7. The fabrication method according to claim 4, wherein after the patterning the crystalline silicon thin film to form the first active region pattern of the first thin film transistor and the second active region pattern of the second thin film transistor, the fabrication method further comprises:
 sequentially forming a first insulating layer, a gate electrode layer, a second insulating layer and a source-drain electrode layer on the first active region pattern and the second active region pattern, the source-drain electrode layer including a first source electrode and a first drain electrode of the first thin film transistor, as well as a second source electrode and a second drain electrode of the second thin film transistor, the first source electrode and the first drain electrode being connected with the first active region pattern through corresponding third via holes respectively, and the second source electrode and the second drain electrode being connected with the second active region pattern through corresponding fourth via holes respectively; and the third via holes and the fourth via holes passing through the first insulating layer and the second insulating layer.

8. The fabrication method according to claim 1, wherein the first thin film transistor is a switching thin film transistor, and the second thin film transistor is a driving thin film transistor.

9. The fabrication method according to claim 8, wherein the array substrate further comprises a gate line and a data line, a source electrode of the first thin film transistor is connected with the data line, a gate electrode of the first thin film transistor is connected with the gate line, and a drain electrode of the first thin film transistor is electrically connected with a gate electrode of the second thin film transistor.

10. An array substrate comprising:
 a base substrate; and
 a first thin film transistor and a second thin film transistor on the base substrate, wherein, as to a same carrier, a mobility of a first active region pattern of the first thin film transistor is substantially smaller than a mobility of a second active region pattern of the second thin film transistor,
 wherein the active layer further includes thereon a laser blocking layer, the laser blocking layer is made of an insulating material,
 a first insulating layer, a gate electrode layer, a second insulating layer and a source-drain electrode layer are sequentially formed on the laser blocking layer, the source-drain electrode layer including a first source electrode and a first drain electrode of the first thin film transistor, as well as a second source electrode and a second drain electrode of the second thin film transistor, the first source electrode and the first drain electrode being connected with the first active region pattern through corresponding first via holes respectively, the second source electrode and the second drain electrode being connected with the second active region pattern through corresponding second via holes respectively; and the first via holes passing through the laser blocking layer, the first insulating layer and the second insulating layer.

11. The array substrate according to claim 10, wherein a crystallinity of the first active region pattern is substantially smaller than a crystallinity of the second active region pattern.

12. The array substrate according to claim 10, wherein as to a same type of carrier, a ratio of the mobility of the first active region pattern of the first thin film transistor to the mobility of the second active region pattern of the second thin film transistor is within a range of 50% to 80%.

13. The array substrate according to claim 10, wherein an orthogonal projection of the laser blocking layer on the base substrate overlaps with an orthogonal projection of the first active region pattern on the base substrate.

14. The array substrate according to claim 10, wherein the orthogonal projection of the laser blocking layer on the base substrate coincides with the orthogonal projection of the first active region pattern on the base substrate.

15. The array substrate according to claim 10, wherein the first thin film transistor is a switching thin film transistor, and the second thin film transistor is a driving thin film transistor.

16. The array substrate according to claim 15, wherein the array substrate further comprises a gate line and a data line, a source electrode of the first thin film transistor is connected with the data line, a gate electrode of the first thin film transistor is connected with the gate line, and a drain electrode of the first thin film transistor is connected with a gate electrode of the second thin film transistor.

17. A display panel, comprising the array substrate according to claim 10.

* * * * *